(12) United States Patent
Tsai et al.

(10) Patent No.: US 9,966,498 B2
(45) Date of Patent: May 8, 2018

(54) METHOD FOR MANUFACTURING LIGHT-EMITTING ELEMENT

(71) Applicant: EPISTAR CORPORATION, Hsinchu (TW)

(72) Inventors: Min-Yen Tsai, Hsinchu (TW); De-Shan Kuo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days. days.

(21) Appl. No.: 15/149,837

(22) Filed: May 9, 2016

(65) Prior Publication Data

US 2016/0254409 A1    Sep. 1, 2016

Related U.S. Application Data

(62) Division of application No. 14/326,270, filed on Jul. 8, 2014.

(51) Int. Cl.
| H01L 33/00 | (2010.01) |
| H01L 33/46 | (2010.01) |
| H01L 33/20 | (2010.01) |

(52) U.S. Cl.
CPC .......... *H01L 33/0079* (2013.01); *H01L 33/20* (2013.01); *H01L 33/46* (2013.01); *H01L 2933/0033* (2013.01); *H01L 2933/0058* (2013.01)

(58) Field of Classification Search
CPC ............................. H01L 33/62; H01L 33/641
See application file for complete search history.

(56) References Cited

U.S. PATENT DOCUMENTS

| 4,217,689 A | 8/1980 | Fujii et al. |
| 5,780,867 A | 7/1998 | Fritz et al. |
| 6,291,839 B1 | 9/2001 | Lester |
| 6,429,462 B1 | 8/2002 | Shveykin |
| 6,743,699 B1 * | 6/2004 | Doan ...................... H01L 21/56 257/E21.502 |

(Continued)

OTHER PUBLICATIONS

Richerzhagen, Bernold, "The waterjet-guided laser in wafer cutting", 1st Korea Switzerland Symposium, Taejon, Korea, Jun. 20, 2000, pp. 1-5.*

(Continued)

*Primary Examiner* — Tom Thomas
*Assistant Examiner* — Vincent Wall
(74) *Attorney, Agent, or Firm* — Muncy, Geissler, Olds & Lowe, P.C.

(57) ABSTRACT

A method for manufacturing a light-emitting element, including steps of: providing a wafer-level element including a wafer and a light-emitting stack on the wafer, wherein the wafer including an upper surface and a bottom surface, and light-emitting stack is formed on the upper surface of the wafer; forming a light-emitting stack on the upper surface of the wafer; cutting the wafer from one of the bottom surface or the top surface of the wafer by a water-jet laser having a first beam size; cutting the wafer from the other one of the bottom surface or the upper surface of the wafer by the water-jet laser having a second beam size; and dividing the wafer-level element wafer and the light-emitting stack into a plurality of light-emitting dies.

7 Claims, 6 Drawing Sheets

(56) References Cited

U.S. PATENT DOCUMENTS

| | | | |
|---|---|---|---|
| 6,768,136 B2 | 7/2004 | Eisert et al. | |
| 7,205,578 B2 | 4/2007 | Eisert et al. | |
| 7,220,996 B2 * | 5/2007 | Furukawa | H01L 33/20 257/103 |
| 7,265,034 B2 * | 9/2007 | Lu | H01L 21/78 257/E21.599 |
| 7,465,959 B2 | 12/2008 | Sugawara | |
| 7,554,124 B2 | 6/2009 | Hata | |
| 8,087,960 B2 | 1/2012 | Duong et al. | |
| 8,343,852 B2 | 1/2013 | Li et al. | |
| 2005/0263854 A1 * | 12/2005 | Shelton | B23K 26/40 257/615 |
| 2007/0096120 A1 * | 5/2007 | Eliashevich | H01L 33/20 257/82 |
| 2007/0187874 A1 | 8/2007 | Daskal et al. | |
| 2010/0270641 A1 | 10/2010 | Manning | |
| 2012/0043568 A1 | 2/2012 | Yan et al. | |
| 2012/0168714 A1 | 7/2012 | Chu et al. | |
| 2014/0198532 A1 * | 7/2014 | Ray | F21V 23/06 362/647 |
| 2014/0312004 A1 | 10/2014 | Suzuki et al. | |

OTHER PUBLICATIONS

Lei et al., "Die singulation technologies for advanced packaging: A critical review", Journal of Vacuum Science & Technology B Microelectronics and Nanometer Structures, Jul. 2012, pp. 040801-1 to 040801-27.*

* cited by examiner

METHOD FOR MANUFACTURING LIGHT-EMITTING ELEMENT

CROSS-REFERENCE TO RELATED APPLICATION

This application is a divisional of co-pending U.S. application Ser. No. 14/326,270, filed on Jul. 8, 2014, for which priority is claimed under 35 U.S.C. § 120, the entire contents of which are hereby incorporated by reference.

TECHNICAL FIELD

The application relates to a light-emitting element and the manufacturing method thereof, in particular, relates to a light-emitting element having a shaped side surface and the manufacturing method thereof.

DESCRIPTION OF BACKGROUND ART

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and has less power-consumption, therefore it is considered as another option of the light source for the illumination markets. The LED applies to various applications like the traffic signal, backlight module, street light, and medical instruments, and is gradually replacing the traditional lighting sources.

A light-emitting device may include a substrate, a light-emitting stack including an n-type semiconductor layer, an active layer and a p-type semiconductor layer. The light-emitting stack may have roughened structure on the surface thereof to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A method for manufacturing a light-emitting element comprises steps of: providing a wafer-level element comprising a wafer and a light-emitting stack on the wafer, wherein the wafer comprising comprises an upper surface and a bottom surface, and light-emitting stack is formed on the upper surface of the wafer; forming a light-emitting stack on the upper surface of the wafer; cutting the wafer from one of the bottom surface or the top surface of the wafer by a water-jet laser having a first beam size; cutting the wafer from the other one of the bottom surface or the upper surface of the wafer by the water-jet laser having a second beam size; and dividing the wafer-level element wafer and the light-emitting stack into a plurality of light-emitting dies.

A light-emitting element comprises: a light-emitting stack configured to emit light; and a transparent substrate comprising an upper surface on which the light-emitting stack is formed, a bottom surface opposite to the upper surface, and a side surface connecting the upper surface with the bottom surface, wherein the side surface comprises a first arc portion, a second arc portion, and a transition portion between the first arc portion and the second arc portion.

A method for manufacturing a light-emitting element, comprises steps of: providing a wafer comprising an upper surface and a bottom surface; forming a light-emitting stack on the upper surface of the wafer; cutting the wafer from the bottom surface of the wafer to form a first arc portion by a water-jet laser having a first beam size; cutting the wafer from the upper surface of the wafer to form a second arc portion by the water-jet laser having a second beam size; dividing the wafer and the light-emitting stack into a plurality of light-emitting dies, wherein one of the light-emitting dies comprises a side surface having the first arc portion and the second arc portion.

DETAILED DESCRIPTION OF PREFERRED EMBODIMENTS

Figure 1A:
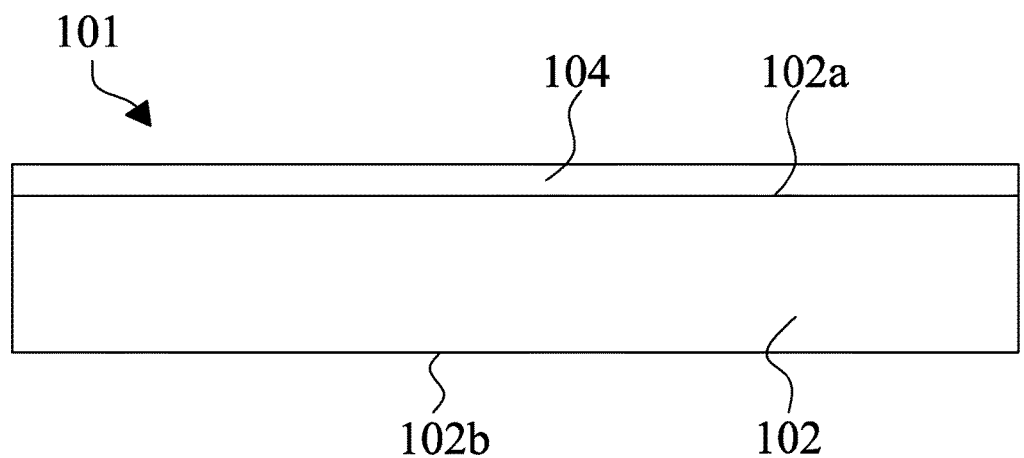
FIGS. 1A to 1G show a manufacturing method of a light-emitting element in accordance with a first embodiment of the present application.
Figure 1B:
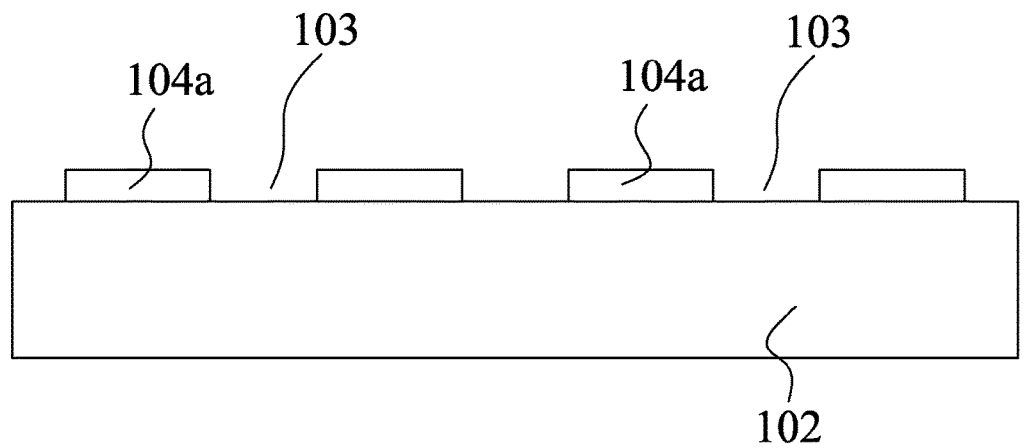

As shown in FIGS. 1A to 1G, a manufacturing method of a light-emitting element in accordance with a first embodiment of the present application is disclosed. Referring to FIG. 1A, a wafer-level element 101 comprising a wafer 102 and a light-emitting stack 104 is provided. The wafer 102 comprises an upper surface 102a and a bottom surface 102b opposite to the upper surface. The light-emitting stack 104 is disposed on the upper surface 102a of the wafer 102. The wafer 102 can be a single-crystalline substrate for growing the light-emitting stack 104 by epitaxial growth method, such as MOCVD. The wafer 102 can comprise an insulating material such as sapphire, or an electrically-conductive material such as SiC, ZnO, GaP or GaAs. The light-emitting stack 104 can comprise III-V semiconductor material, for example, $Al_xIn_yGa_{(1-x-y)}N$ or $Al_xIn_yGa_{(1-x-y)}P$, wherein $0 \leq x$, $y \leq 1$: $(x+y) \leq 1$. Referring to FIG. 1B, a plurality of trenches 103 is formed for dividing the light-emitting stack into multiple light-emitting blocks 104a and exposing part of the upper surface 102a of the wafer 102. The trenches 103 can be formed by laser-scribing or lithography.

Figure 1C:
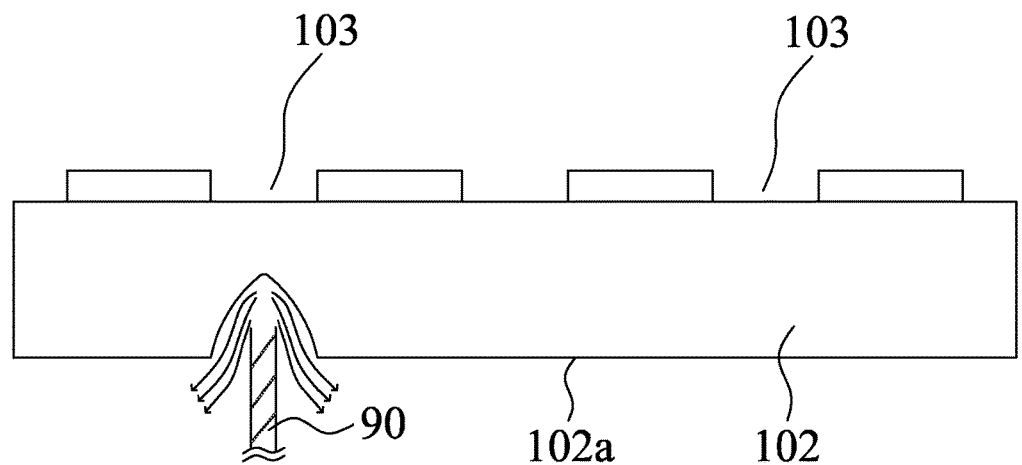
Figure 1D:
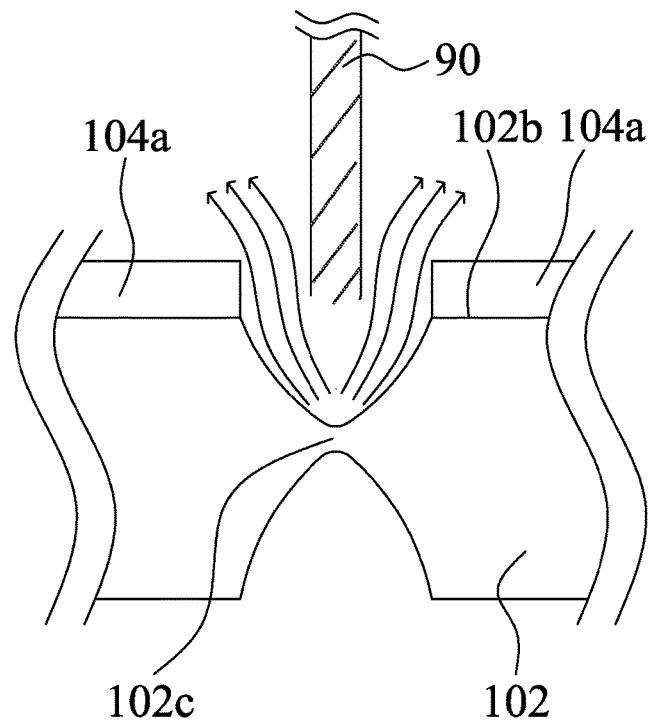
Figure 1E:
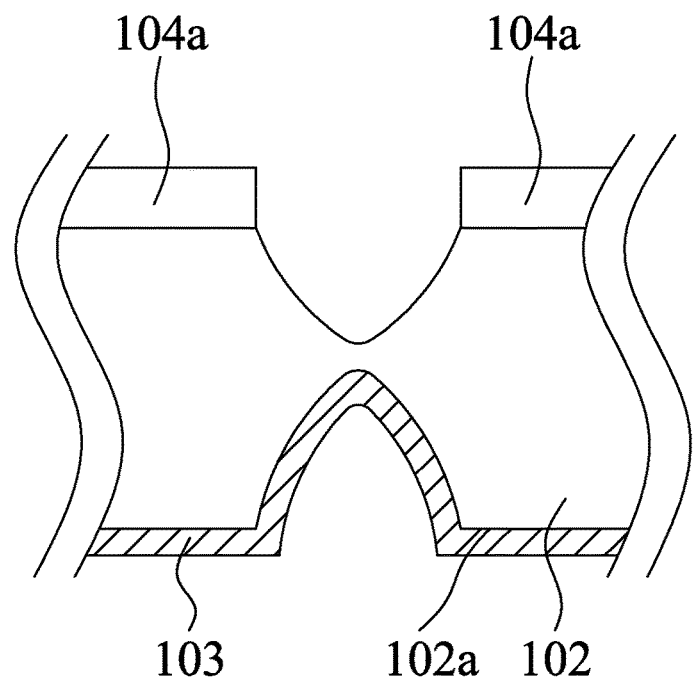

Referring to FIG. 1C, a water-jet laser 90 with a first beam size can be applied to the bottom surface 102a of the wafer 102. The water-jet laser 90 cuts the wafer 102 in accordance with the pattern of the trenches 103, therefore a portion of the wafer 102 is removed from the bottom surface 102a. Referring to FIG. 1D, the water-jet laser 90 with a second beam size can be further applied to the upper surface 102b of the wafer 102 to cut the wafer 102 in accordance with the pattern of the trenches 103. After scribing the wafer 102 by the water-jet laser 90, the wafer is not separated completely but forms a plurality of units, and a thinned portion 102c is formed which connects the units. The first beam size can be bigger than the second beam size to avoid damaging the light-emitting block 104a on the upper surface 102b. Referring to FIG. 1E, a reflective structure 103 can be formed on the bottom surface 102a conformably.

Figure 1F:
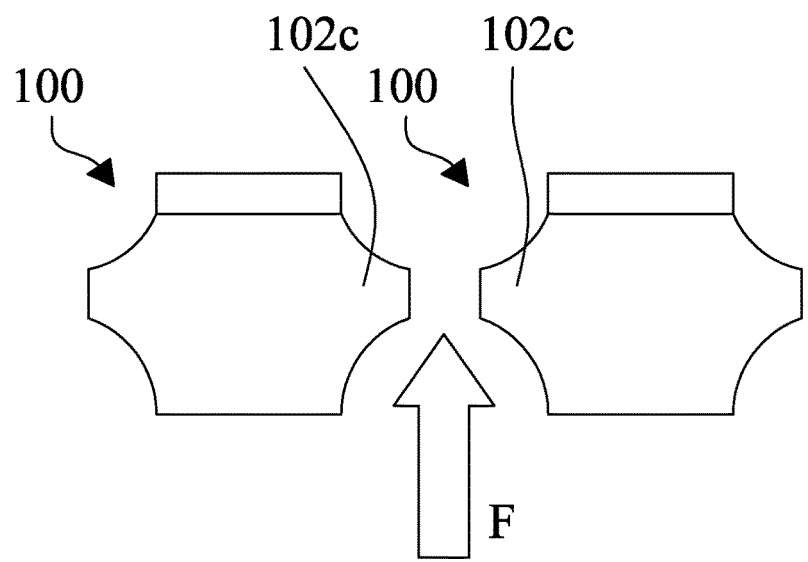

Referring to FIG. 1F, a force F can be applied to the bottom surface 102a to break the thinned portion 102c, therefore the water 102 is divided into a plurality of light-emitting dies 100.

Figure 1G:
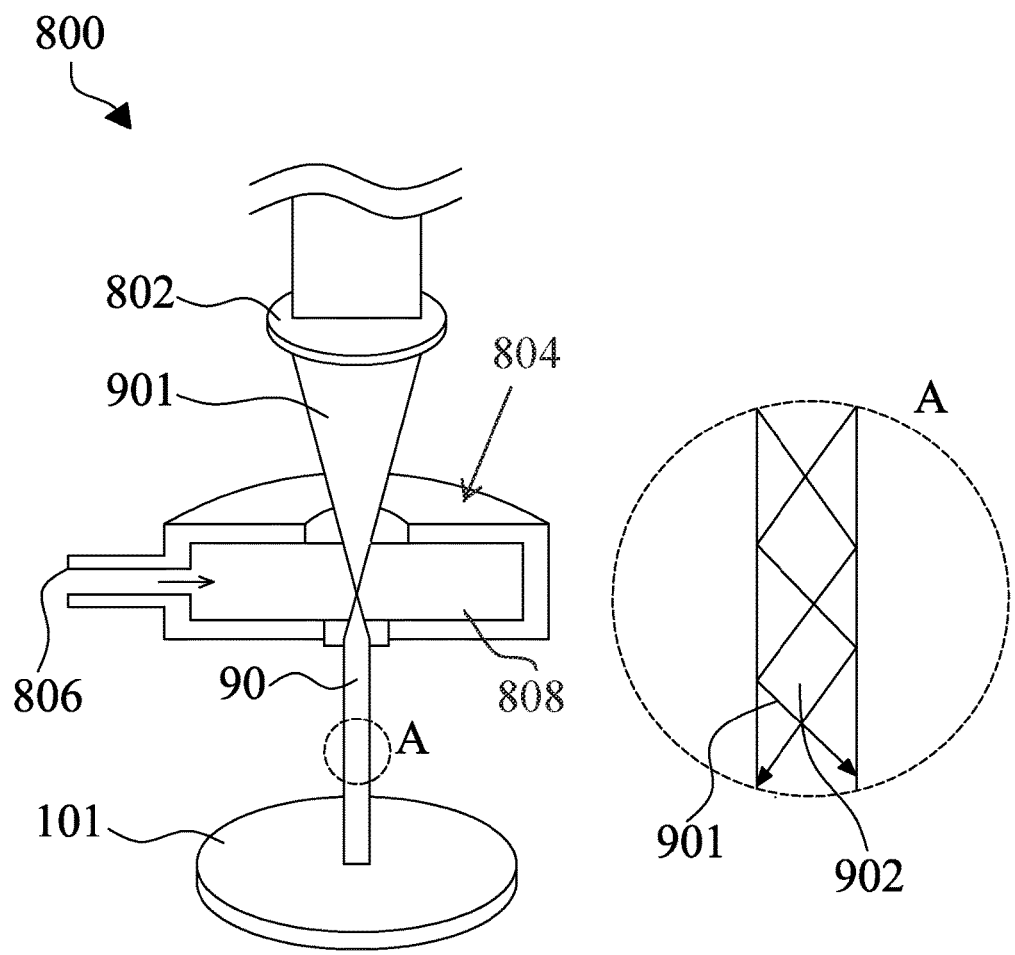

Referring to FIG. 1G, the water-jet laser 90 can be generated from a water-jet laser device 800. The water-jet laser device 800 comprising a focusing lens 802 for focusing a laser 901, a water chamber 804 having an entrance 806 for receiving high-pressure water flow, and a nozzle 808 connected to the water chamber 804 to generate a water jet 902. The water-jet laser 90 comprises the water jet 902 and the laser 901 traveling in the water jet 902.

Figure 2:
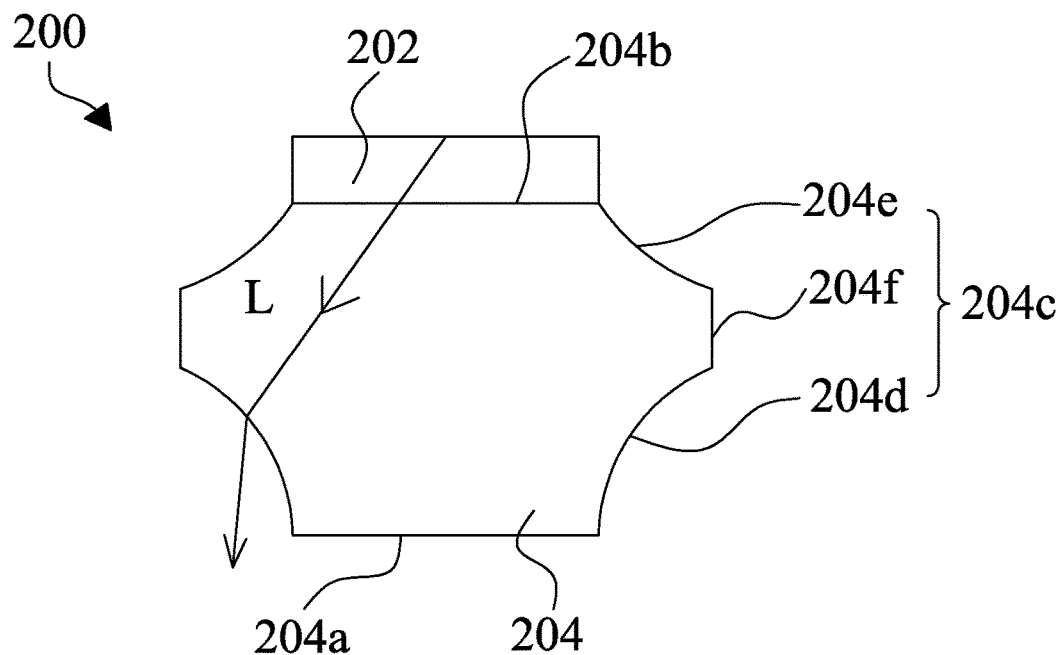
FIG. 2 shows a schematic structure of a light-emitting element in accordance with a first embodiment of the present application.

As shown in FIG. 2, a light-emitting element in accordance with a first embodiment of the present application is disclosed. The light-emitting element 200 comprises: a light-emitting stack 202 configured to emit light L; and a transparent substrate 204 comprising an upper surface 204b on which the light-emitting stack 202 is formed, a bottom surface 204a opposite to the upper surface 204b, and a side surface 204c connecting the upper surface 204b with the bottom surface 204a, wherein the side surface 204c comprises a first arc portion 204d, a second arc portion 204e, and a transition portion 204f between the first arc portion 204d and the second arc portion 204e. The first arc portion 204d can be shaped by the water-jet laser 90 of FIG. 1C, the second arc portion 204e can be shaped by the water-jet laser 90 of FIG. 1D, and the first arc portion 204d can be closer to the bottom surface 204a than the second arc portion 204b. The transition portion 204f can be a flat surface resulted from breaking the thinned portion 102c of FIG. 1F. The transition portion 204f can be the outmost part of the side surface 204c in a lateral direction. To put it differently, the transition portion 204f can have a width wider than that of the bottom surface 204a and the upper surface 204b in a cross-sectional view. Each of the first arc portion 204d and the second arc portion 204e comprises a negative curvature, and the curvature of the first arc portion 204d is different from that of the second arc portion 204e. The light-emitting stack can comprise single heterostructure (SH), double heterostructure (DH), double-side double heterostructure (DDH) or multi-quantum well (MQW). The light-emitting stack can comprise a first semiconductor layer (not shown), a second semiconductor layer (not shown) and an active layer (not shown) between the first semiconductor layer and the second semiconductor layer. The first semiconductor layer can be closer to the transparent substrate 204 than the second semiconductor layer, the first semiconductor layer can be n-type and the second semiconductor layer can be p-type, and a mesa comprising an exposed surface of the first semiconductor layer can be formed by removing a portion of the second semiconductor layer and the active layer. A first electrode can be disposed on the mesa and a second electrode can be disposed on the second semiconductor layer.

Figure 3:
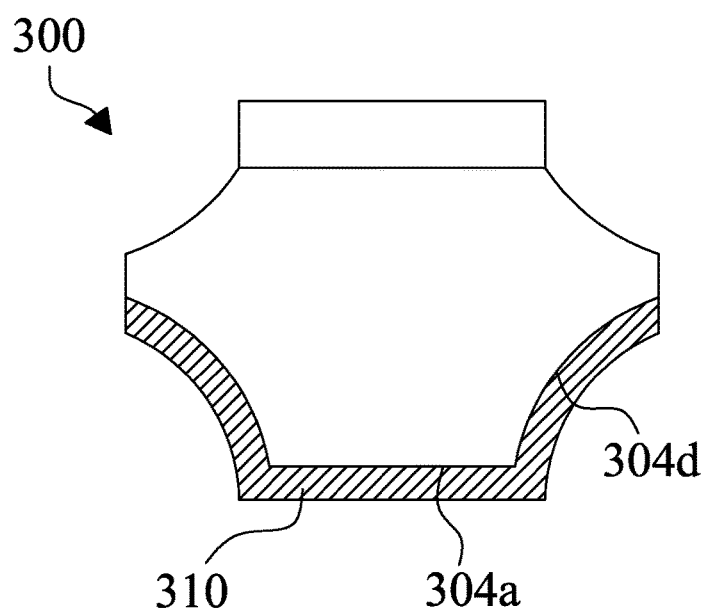
FIG. 3 shows a schematic structure of a light-emitting element in accordance with a third embodiment of the present application.

As shown in FIG. 3, a light-emitting element in accordance with a second embodiment of the present application is disclosed. In comparison with the first embodiment, the light-emitting element 300 further comprises a reflective structure 310 conformably formed on the bottom surface 304a and the first arc portion 304d. The reflective structure 310 can comprise DBR and/or a reflective metal layer.

Figure 4:
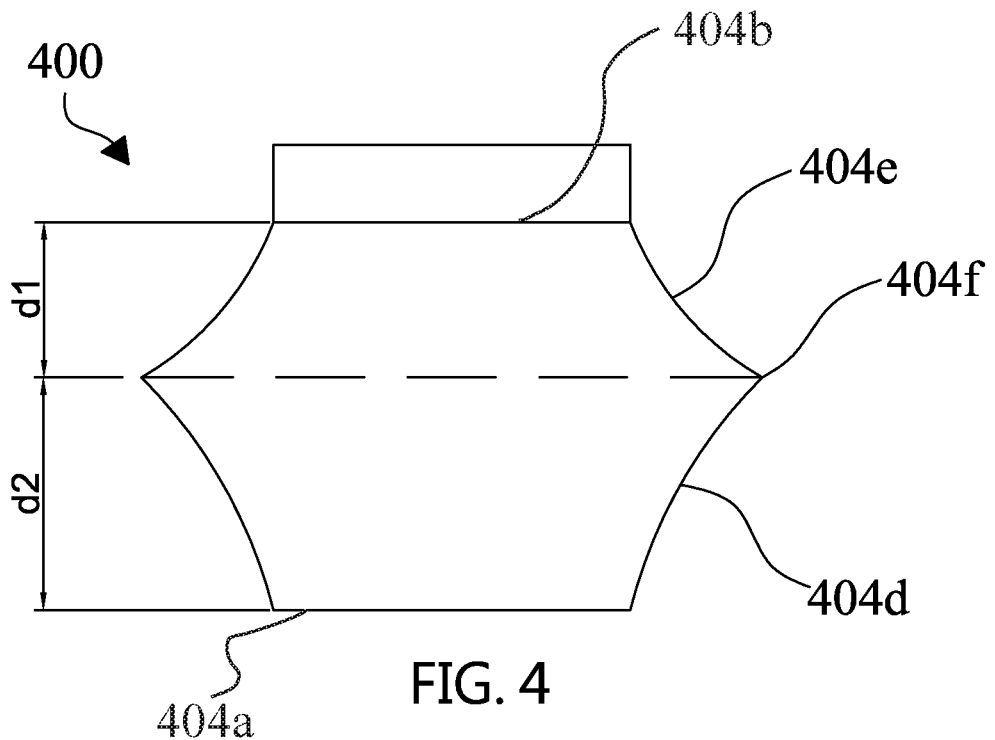
FIG. 4 shows a schematic structure of a light-emitting element in accordance with a forth embodiment of the present application.

As shown in FIG. 4, a light-emitting element in accordance with a third embodiment of the present application is disclosed. In comparison with the first embodiment, the light-emitting element 400 comprises a transition portion 404f being a vertex between the first arc portion 404d and the second arc portion 404e, and a first distance d1 from the upper surface 404b to the transition portion 404f can be shorter than a second distance d2 from the bottom surface 404a to the transition portion 404f. Further referring to FIGS. 1D and 1E, the transition portion 404f can be formed by continuing cutting the wafer 102 with the water-jet laser 90 until penetrating through the wafer 102 completely.

Figure 5:
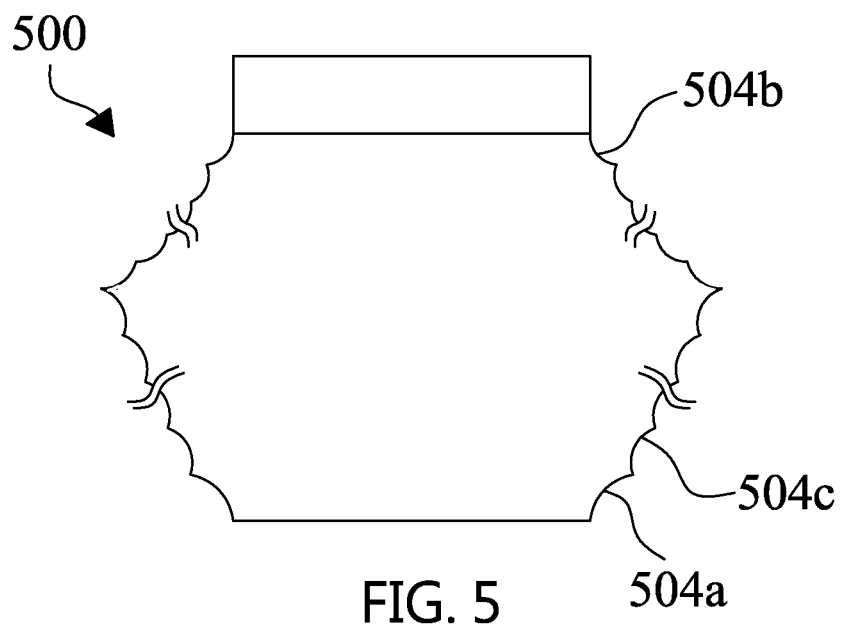
FIG. 5 shows a schematic structure of a light-emitting element in accordance with a five embodiment of the present application.

As shown in FIG. 5, a light-emitting element in accordance with a fourth embodiment of the present application is disclosed. In comparison with the third embodiment, the light-emitting element 500 further comprises a third arc portion 504c between the first arc portion 504a and second arc portion 504b. The third arc portion 504c can have a curvature center different from that of the first arc portion 504a and second arc portion 504b. The third arc portion 504c can be formed by reducing the first beam size of the water-jet laser 90 shown in FIG. 1C to a third beam size after forming the first arc portion 504a. Similarly, by changing the first beam size of the water jet laser 90 shown in FIG. 1C or the second beam size shown in FIG. 1D, a plurality of arc portions having different curvatures can be formed.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing a light-emitting element, comprising
    steps of:
    providing a wafer-level element comprising a wafer and a light-emitting stack on the wafer, wherein the wafer comprises an upper surface and a bottom surface, and the light-emitting stack is formed on the upper surface of the wafer;
    cutting the wafer from one of the bottom surface or the upper surface of the wafer by a water-jet laser having a first beam size to form a first arc portion of the wafer, wherein the first arc portion comprises a first negative curvature;
    cutting the wafer from the other one of the bottom surface or the upper surface of the wafer by the water-jet laser having a second beam size to form a second arc portion of the wafer, wherein the second arc portion comprises a second negative curvature, wherein the first arc portion is closed to the bottom surface, and the second arc portion is closed to the upper surface;
    and
    dividing the wafer-level element into a plurality of light-emitting dies
    wherein one of the light-emitting dies comprises a substrate having the first arc portion and the second arc portion, and
    wherein a reflective structure is formed on the bottom surface and the first arc portion conformably before dividing the wafer-level element into the plurality of light-emitting dies.

2. The method according to claim 1, further comprising forming a plurality of trenches for dividing the light-emitting stack into multiple light-emitting blocks and exposing the upper surface of the wafer before cutting the wafer by the water jet laser, wherein the first arc portion and the second arc portion are formed in the wafer under the light-emitting blocks.

3. The method according to claim 1, wherein the wafer comprises a plurality of thinned portions after being cut by the water-jet laser, and the method further comprises breaking the thinned portions to divide the wafer-level element into the plurality of light-emitting elements.

4. The method according to claim 2, wherein the step of dividing the wafer-level element into a plurality of light-emitting dies comprises continuing cutting the wafer by the water-jet laser to penetrate through the wafer completely.

5. The method according to claim 1, wherein the water-jet laser comprises a water jet and a laser traveling in the water jet.

6. The method according to claim 1, further comprising cutting the wafer from one of the bottom surface or the top surface of the wafer to form a third arc portion by the water-jet laser having a third beam size different from the first beam size or the second beam size.

7. The method according to claim 6, wherein the first beam size is bigger than one of the second beam size and the third beam size.

* * * * *